United States Patent
Masuda

(10) Patent No.: US 9,704,957 B2
(45) Date of Patent: Jul. 11, 2017

(54) SILICON CARBIDE SEMICONDUCTOR DEVICE AND METHOD OF MANUFACTURING THE SAME

(71) Applicant: Sumitomo Electric Industries, Ltd., Osaka-shi (JP)

(72) Inventor: Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/914,214

(22) PCT Filed: Jul. 9, 2014

(86) PCT No.: PCT/JP2014/068265
§ 371 (c)(1),
(2) Date: Feb. 24, 2016

(87) PCT Pub. No.: WO2015/029607
PCT Pub. Date: Mar. 5, 2015

(65) Prior Publication Data
US 2016/0218186 A1    Jul. 28, 2016

(30) Foreign Application Priority Data

Aug. 28, 2013  (JP) .................................. 2013-177030

(51) Int. Cl.
*H01L 29/16*    (2006.01)
*H01L 29/66*    (2006.01)
(Continued)

(52) U.S. Cl.
CPC ...... *H01L 29/1608* (2013.01); *H01L 21/0465* (2013.01); *H01L 29/045* (2013.01);
(Continued)

(58) Field of Classification Search
CPC . H01L 29/1608; H01L 29/045; H01L 29/086; H01L 29/1095; H01L 29/4236;
(Continued)

(56) References Cited

U.S. PATENT DOCUMENTS 8,525,189 B2 *  9/2013  Tarui .................... H01L 21/046
                                                        257/77
8,680,538 B2 *  3/2014  Tarui .................. H01L 29/0615
                                                        257/135
(Continued)

FOREIGN PATENT DOCUMENTS

JP    2004-134595 A    4/2004
JP    2004-522305 A    7/2004
(Continued)

OTHER PUBLICATIONS

English Machine Translation of WO 2011/089861, Panasonic Corporation, WIPO website accessed and translated on Oct. 16, 2016.*

(Continued)

*Primary Examiner* — Earl Taylor
(74) *Attorney, Agent, or Firm* — Venable LLP; Michael A. Sartori; F. Brock Riggs

(57) ABSTRACT

The silicon carbide semiconductor layer includes a first impurity region, a second impurity region, and a third impurity region. Turning to a first position at which an impurity concentration 1/10 as high as a highest impurity concentration is exhibited in a concentration profile of an impurity having the first conductivity type in a direction perpendicular to the main surface in the third impurity region and a second position at which an impurity concentration 1/10 as high as a highest impurity concentration is exhibited in a concentration profile of an impurity having the second conductivity type in the direction perpendicular to the main surface in the second impurity region, a first depth from the main surface to the first position is shallower than (Continued)

a second depth from the main surface to the second position. The electrode is electrically connected to the second impurity region and the third impurity region.

10 Claims, 9 Drawing Sheets

(51) Int. Cl.
| | |
|---|---|
| *H01L 21/04* | (2006.01) |
| *H01L 29/78* | (2006.01) |
| *H01L 29/04* | (2006.01) |
| *H01L 29/08* | (2006.01) |
| *H01L 29/10* | (2006.01) |
| *H01L 29/423* | (2006.01) |

(52) U.S. Cl.
CPC ........ *H01L 29/086* (2013.01); *H01L 29/1095* (2013.01); *H01L 29/4236* (2013.01); *H01L 29/66068* (2013.01); *H01L 29/7802* (2013.01); *H01L 29/7813* (2013.01)

(58) Field of Classification Search
CPC ........... H01L 29/66068; H01L 29/7802; H01L 29/7813; H01L 21/0465
See application file for complete search history.

(56) References Cited

U.S. PATENT DOCUMENTS

| | | | | |
|---|---|---|---|---|
| 8,742,427 | B2* | 6/2014 | Kitabatake | H01L 29/7828 257/341 |
| 8,932,944 | B2* | 1/2015 | Tarui | H01L 21/046 438/518 |
| 8,933,466 | B2* | 1/2015 | Uchida | H01L 27/0629 257/288 |
| 9,318,588 | B2* | 4/2016 | Hara | H01L 29/0834 |
| 2002/0160573 | A1* | 10/2002 | Peake | H01L 29/66348 438/270 |
| 2007/0170436 | A1* | 7/2007 | Sugawara | H01L 29/0615 257/77 |
| 2008/0197379 | A1* | 8/2008 | Aono | H01L 29/0834 257/133 |
| 2008/0230787 | A1* | 9/2008 | Suzuki | H01L 29/0623 257/77 |
| 2008/0315211 | A1* | 12/2008 | Ichikawa | H01L 21/0485 257/77 |
| 2009/0261348 | A1* | 10/2009 | Tarui | H01L 29/0615 257/77 |
| 2010/0193800 | A1* | 8/2010 | Uchida | H01L 29/66068 257/77 |
| 2010/0200931 | A1* | 8/2010 | Matocha | H01L 21/0465 257/401 |
| 2010/0314629 | A1* | 12/2010 | Tarui | H01L 29/0615 257/77 |
| 2011/0204374 | A1* | 8/2011 | Kimura | H01L 27/016 257/66 |
| 2012/0132924 | A1* | 5/2012 | Tarui | H01L 21/046 257/77 |
| 2013/0210208 | A1* | 8/2013 | Hayashi | H01L 29/66477 438/285 |
| 2013/0309851 | A1* | 11/2013 | Tarui | H01L 21/046 438/514 |
| 2014/0070268 | A1* | 3/2014 | Yoshimura | H01L 29/0834 257/139 |
| 2014/0184211 | A1* | 7/2014 | Fujita | G01R 33/0052 324/225 |
| 2015/0069460 | A1* | 3/2015 | Hara | H01L 29/7395 257/139 |
| 2016/0218186 | A1* | 7/2016 | Masuda | H01L 21/0465 |

FOREIGN PATENT DOCUMENTS

| | | |
|---|---|---|
| JP | 2008-235546 A | 10/2008 |
| JP | 2009-004573 A | 1/2009 |
| JP | 2009-032921 A | 2/2009 |
| JP | 2009-231545 A | 10/2009 |
| JP | 2012-104746 A | 5/2012 |
| JP | 2012-129492 A | 7/2012 |
| JP | 2013-165198 A | 8/2013 |
| WO | WO-2009/139140 A1 | 11/2009 |
| WO | WO-2011/089861 A1 | 7/2011 |

OTHER PUBLICATIONS

Rao et al., Phosphorus and boron implantation in 6H—SiC, Journal of Applied Physics, vol. 81, No. 10, 1997, pp. 6635-6641.*
International Search Report in PCT International Application No. PCT/JP2014/068265, dated Oct. 14, 2014.

* cited by examiner

SILICON CARBIDE SEMICONDUCTOR DEVICE AND METHOD OF MANUFACTURING THE SAME

TECHNICAL FIELD

The present invention relates to a silicon carbide semiconductor device and a method of manufacturing the same, and particularly to a silicon carbide semiconductor device having an ohmic electrode low in contact resistance and a method of manufacturing the same.

BACKGROUND ART

From a point of view of lowering in on resistance, a contact resistance between a silicon carbide semiconductor layer and an electrode is preferably lower in a silicon carbide semiconductor device containing silicon carbide (SiC) as a semiconductor material.

In order to lower a contact resistance between the silicon carbide semiconductor layer and the electrode, in general, a contact region high in impurity concentration is formed in the silicon carbide semiconductor layer. For example, when the silicon carbide semiconductor device is implemented as an MOSFET, a well region is formed in the silicon carbide semiconductor layer, and a source region and a contact region in contact with the source region and high in impurity concentration are formed in the well region.

Since silicon carbide is extremely low in coefficient of diffusion of an impurity, doping with an impurity through a thermal diffusion process is difficult. Therefore, ion implantation or epitaxial growth has been used for forming an active region in a method of manufacturing a silicon carbide semiconductor device.

WO2009/139140 describes a silicon carbide semiconductor device in which a p+ type contact region is formed to be deeper than a source region located around the same. The p+ contact region is formed through ion implantation.

CITATION LIST

Patent Document

PTD 1: WO2009/139140

SUMMARY OF INVENTION

Technical Problem

In order to form a contact region high in impurity concentration to a deep position, however, a large dose amount is required. Therefore, an implantation time period required for forming a contact region has been longer than an implantation time period required for forming other active regions such as a source region. Consequently, the step of forming a contact region has been one factor for interfering improvement in efficiency in manufacturing a silicon carbide semiconductor device.

The present invention was made to solve the problems as above. A primary object of the present invention is to provide a silicon carbide semiconductor device which can be manufactured at high manufacturing efficiency and a method of manufacturing the same.

Solution to Problem

A silicon carbide semiconductor device according to the present invention includes a silicon carbide semiconductor layer including a main surface and an electrode formed on the main surface, and the silicon carbide semiconductor layer includes a first impurity region having a first conductivity type, a second impurity region including the main surface, provided in the first impurity region, and having a second conductivity type different from the first conductivity type, and a third impurity region including the main surface, provided in the first impurity region, formed adjacently to the second impurity region, and having the first conductivity type. Turning to a first position at which an impurity concentration 1/10 as high as a highest impurity concentration is exhibited in a concentration profile of an impurity having the first conductivity type in a direction perpendicular to the main surface in the third impurity region and a second position at which an impurity concentration 1/10 as high as a highest impurity concentration is exhibited in a concentration profile of an impurity having the second conductivity type in the direction perpendicular to the main surface in the second impurity region, a first depth from the main surface to the first position is shallower than a second depth from the main surface to the second position, and the electrode is electrically connected to the second impurity region and the third impurity region.

Advantageous Effects of Invention

According to the present invention, a silicon carbide semiconductor device which can be manufactured at high manufacturing efficiency and a method of manufacturing the same can be provided.

DESCRIPTION OF EMBODIMENTS

Figure 1:
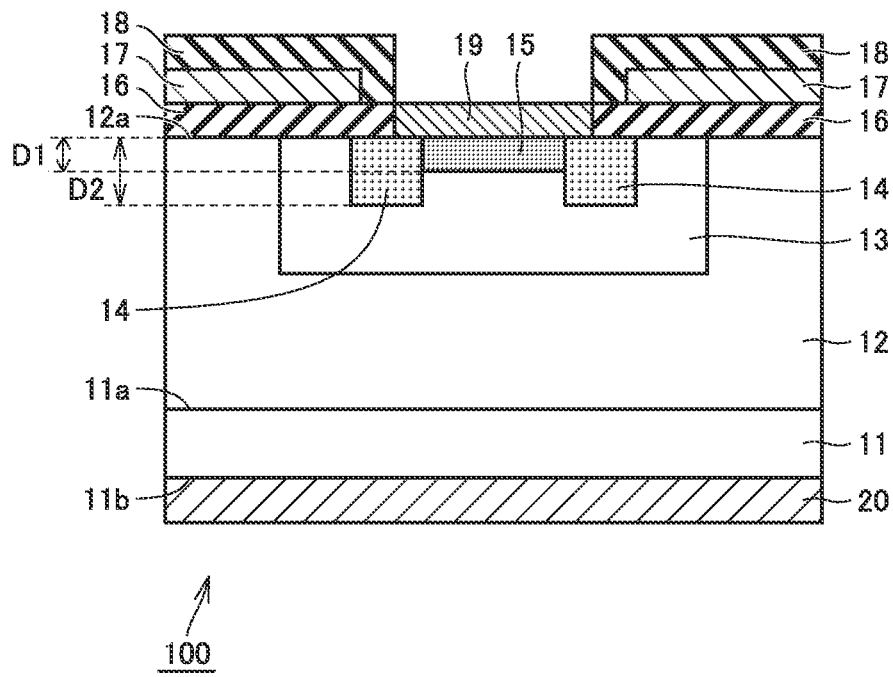
FIG. 1 is a cross-sectional view of a silicon carbide semiconductor device according to a first embodiment.

An embodiment of the present invention will be described hereinafter with reference to the drawings. In the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is expressed by a number with a bar "-" thereabove, however, a negative sign herein precedes a number. In expressing an angle, a system in which a total azimuth angle is defined as 360 degrees is employed.

A "depth" of each impurity region in a silicon carbide semiconductor layer herein refers to a distance between a main surface and a position at which an impurity concentration 1/10 as high as a highest impurity concentration is exhibited in an impurity concentration profile in a direction perpendicular to the main surface when each impurity concentration includes the main surface of a silicon carbide layer. In addition, a "depth" of each impurity region refers to a distance between a main surface and a position at which an impurity concentration 1/10 as high as a highest impurity concentration is exhibited, which is deeper than a position at which the highest impurity concentration is exhibited.

DESCRIPTION OF EMBODIMENTS OF INVENTION OF PRESENT APPLICATION

Overview of an embodiment of the present invention will initially be described.

Figure 12:
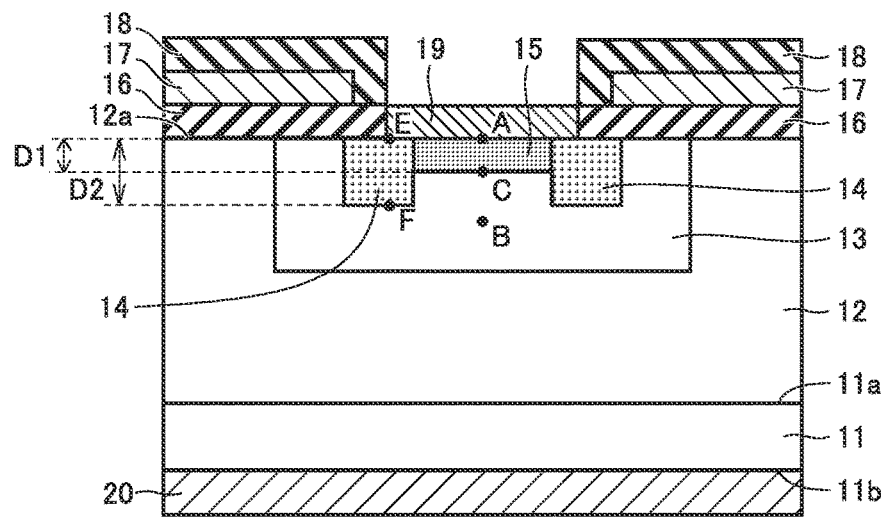
FIG. 12 is a cross-sectional view for illustrating a function and effect of the silicon carbide semiconductor device according to the first embodiment.
Figure 13:
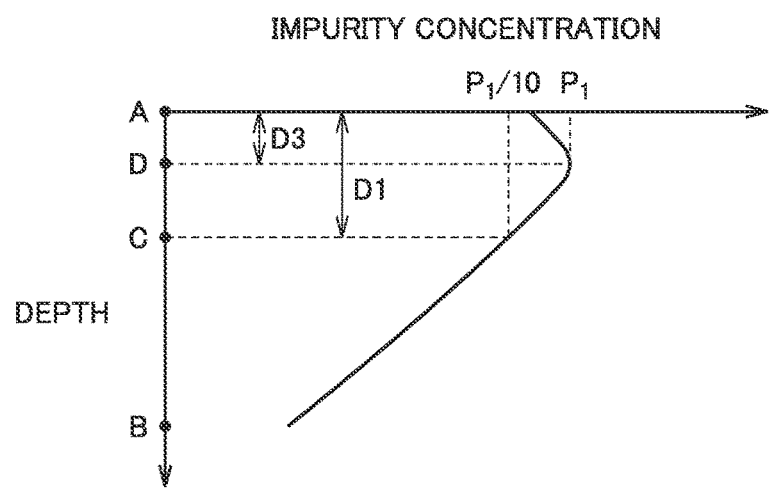
FIG. 13 is a cross-sectional view for illustrating a function and effect of the silicon carbide semiconductor device according to the first embodiment.
Figure 14:
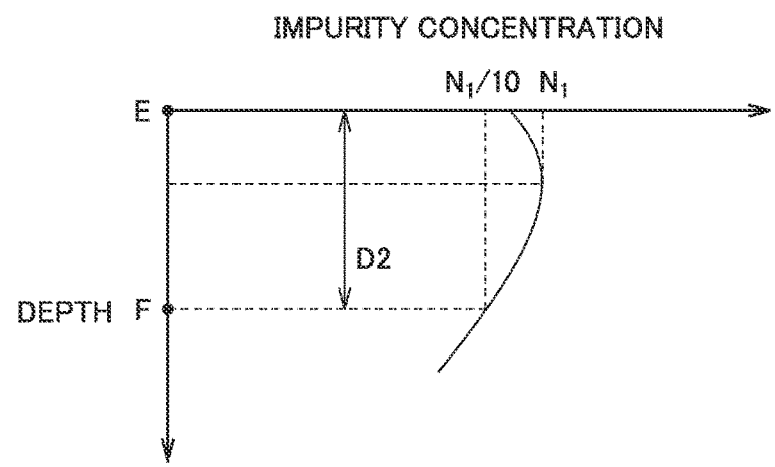
FIG. 14 is a cross-sectional view for illustrating a function and effect of the silicon carbide semiconductor device according to the first embodiment.

(1) A silicon carbide semiconductor device according to the present embodiment includes a silicon carbide semiconductor layer 12 including a main surface (a third main surface 12a) and an electrode (a source electrode 19) formed on the main surface (third main surface 12a). Silicon carbide semiconductor layer 12 includes a first impurity region (a body region 13) having a first conductivity type (p), a second impurity region (a source region 14) including the main surface (third main surface 12a), provided in the first impurity region (13), and having a second conductivity type (n) different from the first conductivity type, and a third impurity region (a p+ contact region 15) including the main surface (third main surface 12a), provided in the first impurity region (13), formed adjacently to the second impurity region (14), and having the first conductivity type. Turning to a first position (C: FIG. 13) at which an impurity concentration 1/10 as high as a highest impurity concentration is exhibited in a concentration profile of an impurity having the first conductivity type in a direction perpendicular to the main surface (third main surface 12a) in the third impurity region (15) and a second position (F: FIG. 14) at which an impurity concentration 1/10 as high as a highest impurity concentration is exhibited in a concentration profile of an impurity having the second conductivity type in the direction perpendicular to the main surface (third main surface 12a) in the second impurity region (14), a first depth (D1: FIG. 12) from the main surface (12a) to the first position is shallower than a second depth (D2: FIG. 12) from the main surface (12a) to the second position. The electrode (source electrode 19) is electrically connected to the second impurity region (14) and the third impurity region (15).

Namely, in the silicon carbide semiconductor device according to the present embodiment, while p+ contact region 15 is formed to be shallower with respect to third main surface 12a than source region 14 adjacent in body region 13, it is connected to body region 13 in the direction perpendicular to third main surface 12a. Here, source region 14 and p+ contact region 15 establish ohmic contact with source electrode 19 on third main surface 12a. Therefore, source region 14, p+ contact region 15, and body region 13 connected to p+ contact region 15 can be the same in potential.

Furthermore, while the silicon carbide semiconductor device according to the present embodiment includes p+ contact region 15 high in concentration of an impurity, efficiency in manufacturing the same can be improved. As described above, p+ contact region 15 is formed to be shallower with respect to third main surface 12a than source region 14 adjacent in body region 13. Therefore, a dose amount required for forming p+ contact region 15 can be kept smaller than in a case that p+ contact region 15 is formed to be as deep as or deeper than the second position of source region 14 with respect to third main surface 12a. Thus, an implantation time period required for forming p+ contact region 15 can be shortened. Consequently, the silicon carbide semiconductor device according to the present embodiment can achieve a sufficiently lowered contact resistance between source electrode 19 and p+ contact region 15 (body region 13) and improvement in manufacturing efficiency.

(2) In the silicon carbide semiconductor device according to the present embodiment, a depth (D3: FIG. 13) from the main surface (third main surface 12a), of a position (D: FIG. 13) at which the highest impurity concentration is exhibited in the third impurity concentration (p+ contact region 15) may be not greater than 0.1 µm. Thus, since the position (D) at which the highest impurity concentration is exhibited in p+ contact region 15 is formed in the vicinity of third main surface 12a, a contact resistance between the electrode (source electrode 19) formed on the main surface (12a) and the third impurity region (15) can effectively be lowered.

(3) In the silicon carbide semiconductor device according to the present embodiment, the first depth (D1: FIG. 13) may be not greater than 0.2 µm.

Since the first position (C) of p+ contact region 15 is thus formed at a position shallower with respect to the main surface than a p+ contact region in a conventional silicon carbide semiconductor device, an implantation time period can be suppressed also when p+ contact region 15 is formed through ion implantation.

(4) In the silicon carbide semiconductor device according to the present embodiment, the silicon carbide semiconductor layer (12) may be provided with a trench TR at which the first impurity region (body region 13) and the second impurity region (source region 14) are exposed at a sidewall SW, and the silicon carbide semiconductor device may further include a gate oxide film (16) formed on sidewall SW of the trench (TR) and a gate electrode (17) formed on the gate oxide film (16).

Figure 18:
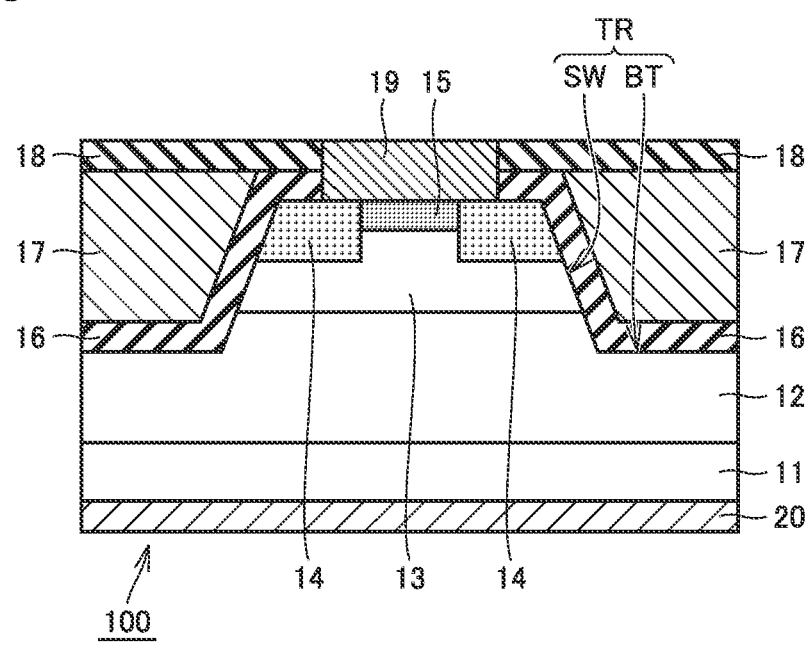
FIG. 18 is a cross-sectional view of a modification of the silicon carbide semiconductor device according to the first embodiment.

The silicon carbide semiconductor device according to the present embodiment can thus be applied to a trench MOSFET (see FIG. 18). Thus, a silicon carbide semiconductor device as a trench MOSFET low in contact resistance between source electrode 19 and p+ contact region 15 and high in manufacturing efficiency can be obtained.

(5) In the silicon carbide semiconductor device according to the present embodiment, sidewall SW may include a first plane having a plane orientation {0-33-8}.

When the silicon carbide semiconductor device according to the present embodiment is implemented as a trench MOSFET, a conduction channel is formed in body region 13 exposed at sidewall SW. Here, when sidewall SW of trench TR has the first plane having the plane orientation {0-33-8}, mobility of carriers in the conduction channel formed in body region 13 exposed at sidewall SW can be enhanced. Furthermore, an interface state density at an interface between gate oxide film 16 formed on sidewall SW and body region 13 can be lowered.

(6) In the silicon carbide semiconductor device according to the present embodiment, the first impurity region (body region 13) may include the main surface (third main surface 12a), and the silicon carbide semiconductor device may further include a gate oxide film (16) formed on the main surface (12a) included in the first impurity region (13) and a gate electrode (17) formed on the gate oxide film (16).

The silicon carbide semiconductor device according to the present embodiment can thus be applied to a planar MOSFET (see FIG. 1). A silicon carbide semiconductor device as a planar MOSFET low in contact resistance between source electrode 19 and p+ contact region 15 and high in manufacturing efficiency can thus be obtained.

(7) A method of manufacturing a silicon carbide semiconductor device according to the present embodiment includes the steps of preparing a silicon carbide semiconductor layer (12) including a first impurity region (body region 13) having a first conductivity type (a p-type) (S10) and forming a mask layer (80, 83) on a main surface of the silicon carbide semiconductor layer (12) (S20). An opening portion is formed over the first impurity region (13) in the mask layer (80, 83) and the mask layer (80, 83) includes in the opening portion, a protection mask portion (80A) arranged at a distance from an inner peripheral wall surface of the opening portion. The method further includes the steps of forming a mask layer (80, 83) (S20), forming a second impurity region (source region 14) having a second conductivity type (n-type) different from the first conductivity type (p-type) by implanting ions into the first impurity region (13) other than at least a region under the protection mask portion (80A, 83A) in the opening portion with the mask layer (80, 83) serving as a mask (S30), removing the mask layer (80, 83) (S40), and forming a third impurity region (p+ contact region 15) having the first conductivity type (p-type) in a region within the first impurity region (13) which has been located under the protection mask portion (80A, 83A), by implanting ions into the silicon carbide semiconductor layer (12) (S50).

Namely, in the step of forming source region 14 (S30), the opening portion in mask layer 80 is formed in a region over the body region (13) where source region 14 is to be formed, whereas a region where p+ contact region 15 to be is formed is protected by protection mask portions 80A and 81A. Therefore, when a dose amount necessary for forming source region 14 is implanted in the step (S30), protection mask portion 80A blocks ion implantation into the region where p+ contact region 15 is to be formed or protection mask portion 81A restricts ion implantation thereinto. Consequently, an n-type region 14A (see FIG. 8) having the n-type is not formed in body region 13 where p+ contact region 15 is to be formed through ion implantation in the step (S30) (FIG. 15), or n-type region 14A (see FIG. 8) is formed to be shallower than source region 14 in body region 13. Therefore, in the step (S50), a dose amount necessary in forming p+ contact region 15 for connection to body region 13 can be kept small.

In a conventional method of manufacturing a silicon carbide semiconductor layer in which source region 14 is formed with mask layer 80 not having protection mask portion 80A being formed, source region 14 is formed to extend also to a region where p+ contact region 15 is to be formed (from a different point of view, n-type region 14A is formed to a depth as deep as source region 14). In this case, in order to form p+ contact region 15 to connect to body region 13, replacement with p+ contact region 15 by implanting ions of a p-type impurity into n-type region 14A is required. Here, a dose amount required for replacing n-type region 14A with p+ contact region 15 (a dose amount required for forming p+ contact region 15 to connect to body region 13) depends on a thickness of n-type region 14A with respect to third main surface 12a. Therefore, in the conventional manufacturing method in which n-type region 14A is formed to a depth as deep as source region 14, a large dose amount has been required for replacing n-type 14A with p+ contact region 15 and such an implantation step has been performed with a long time period being spent.

Namely, according to the method of manufacturing a silicon carbide semiconductor device according to the present embodiment, a dose amount required for forming p+ contact region 15 can be kept small and hence an implantation time period required for forming p+ contact region 15 can be shorter than in the conventional method. Consequently, a silicon carbide semiconductor device sufficiently low in contact resistance between source electrode 19 and p+ contact region 15 can be obtained at high manufacturing efficiency.

(8) In the step of forming a mask layer (83) in the method of manufacturing a silicon carbide semiconductor device according to the present embodiment, the protection mask portion (81A) may be formed to be smaller in thickness than a portion of the mask layer (83) other than the protection mask portion (81A) (another mask portion 80B), and in the step of forming a second impurity region (source region 14), a fourth impurity region (n-type region 14A) having the second conductivity type (n-type) may be formed by implanting ions into the silicon carbide semiconductor layer (12) with the protection mask portion (81A) being interposed.

When protection mask portion 81A is formed to be smaller in thickness than another mask portion 80B in mask layer 83, a dose amount in ion implantation into a region where p+ contact region 15 is to be formed is decreased by protection mask portion 81A in the step of forming source region 14 (S30). Namely, as source region 14 is formed in the present step (S30), n-type region 14A is formed also in the region where p+ contact region 15 is to be formed. Here, since the dose amount is smaller in n-type region 14A in accordance with a thickness of protection mask portion 80A than in source region 14 formed under the opening portion in mask layer 83, n-type region 14A is formed to be shallower with respect to third main surface 12a than source region 14. Consequently, so long as p+ contact region 15 is formed to a position deeper than n-type region 14A with respect to third main surface 12a, p+ contact region 15 can be connected to body region 13 as replacing n-type region 14A, even though it is formed at a position shallower than source region 14. Namely, in the step of forming p+ contact region 15 (S50), even though p+ contact region 15 is formed to be high in impurity concentration, a dose amount required for forming p+ contact region 15 (a dose amount required for replacing n-type region 14A with p+ contact region 15) can be kept smaller than in the conventional method. Consequently, since an implantation time period required for forming p+ contact region 15 can be shortened as described above, a silicon carbide semiconductor device sufficiently low in contact resistance between source electrode 19 and p+ contact region 15 can be manufactured at high manufacturing efficiency.

(9) In the method of manufacturing a silicon carbide semiconductor device according to the present embodiment, in the step of forming a third impurity region (p+ contact region 15) (S50), turning to a first position (C: FIG. 13) at which an impurity concentration 1/10 as high as a highest impurity concentration is exhibited in a concentration profile of an impurity having the first conductivity type in a direction perpendicular to the main surface (third main surface 12a) in the third impurity region (15) and a second position (F: FIG. 14) at which an impurity concentration 1/10 as high as a highest impurity concentration is exhibited in a concentration profile of an impurity having the second conductivity type in the direction perpendicular to the main surface (12a) in the second impurity region (14) formed in the step of forming a second impurity region (source region 14) (S30), the third impurity region may be formed such that a first depth (D1: FIG. 12) from the main surface (12a) to the first position is shallower than a second depth (D2: FIG. 12) from the main surface (12a) to the second position.

By doing so as well, p+ contact region 15 can be formed to be connected to body region 13. Specifically, in order to form p+ contact region 15 to connect to body region 13, p+ contact region 15 should be formed to a region deeper than n-type region 14A in the step of forming p+ contact region 15 (S50). As described above, in the method of manufacturing a silicon carbide semiconductor device according to the present embodiment, in the step of forming source region 14 (S30), mask layer 80 including protection mask portion 80A is employed as an ion implantation mask, so that implantation of n-type ions onto the region where p+ contact region 15 is to be formed is blocked (n-type region 14A is not formed), or n-type region 14A is formed to be shallower (to be smaller in thickness) with respect to third main surface 12a than adjacent source region 14. Therefore, when p+ contact region 15 is formed to be shallower than source region 14 with respect to third main surface 12a, p+ contact region 15 and body region 13 can be connected to each other. Consequently, a dose amount required for forming p+ contact region 15 can be kept smaller than in the conventional method, and a silicon carbide semiconductor device sufficiently low in contact resistance between source electrode 19 and p+ contact region 15 can be manufactured at high manufacturing efficiency.

(10) In the method of manufacturing a silicon carbide semiconductor device according to the present embodiment, in the step of forming a mask layer (80) (S20), the mask layer (80) in which the protection mask portion (80A) is formed from a single layer and a portion other than the protection mask portion (80A) (another mask portion 80B) is formed from two layers may be formed. By doing so, in the step (S20), by removing, for example, an upper layer in a stack constituted of two layers, the protection mask portion (80A) smaller in thickness by the thickness of the upper layer than another portion (80B) constituted of the two layers can readily be formed.

DETAILS OF EMBODIMENTS OF INVENTION
OF PRESENT APPLICATION

Embodiments of the present invention will now be described in further detail.

First Embodiment

A structure of a silicon carbide semiconductor device 100 according to a first embodiment will initially be described with reference to FIG. 1. Silicon carbide semiconductor device 100 according to the first embodiment is implemented as a planar MOSFET. Silicon carbide semiconductor device 100 includes an epitaxial substrate 10, a gate oxide film 16, a gate electrode 17, an interlayer insulating film 18, a source electrode 19, and a drain electrode 20. Epitaxial substrate 10 includes a base substrate 11, silicon carbide semiconductor layer 12, body region 13, source region 14, and p+ contact region 15.

Base substrate 11 is composed of single-crystal silicon carbide having hexagonal crystal system and have an n conductivity type (the second conductivity type). Base substrate 11 contains an impurity such as N (nitrogen) at a high concentration. A concentration of an impurity such as nitrogen contained in base substrate 11 is, for example, around $1.0 \times 10^{18}$ cm$^{-3}$. Base substrate 11 includes a first main surface 11a and a second main surface 11b located opposite to first main surface 11a.

Silicon carbide semiconductor layer 12 has the n conductivity type. Silicon carbide semiconductor layer 12 is an epitaxial layer formed on first main surface 11a of base substrate 11. Silicon carbide semiconductor layer 12 contains an impurity such as nitrogen (N). A concentration of an impurity in silicon carbide semiconductor layer 12 is lower than a concentration of an impurity in base substrate 1, and it is, for example, not lower than $1 \times 10^{15}$ cm$^{-3}$ and not higher than $5 \times 10^{16}$ cm$^{-3}$. Silicon carbide semiconductor layer 12 includes third main surface 12a located opposite to second main surface 11b of base substrate 11.

Body region 13 has the p conductivity type (the first conductivity type). Body region 13 is formed on silicon carbide semiconductor layer 12 and includes third main surface 12a. Body region 13 contains an impurity such as aluminum (Al) or boron (B). Body region 13 has an impurity concentration not lower than $4 \times 10^{16}$ cm$^{-3}$ and not higher than $2 \times 10^{18}$ cm$^{-3}$, and for example, around $1 \times 10^{17}$ cm$^{-3}$. Body region 13 has a thickness, for example, around 0.8 μm.

Source region 14 has the n conductivity type. Source region 14 is formed on body region 13 and includes third main surface 12a. Source region 14 contains an impurity such as N. Source region 14 has an impurity concentration not lower than $5 \times 10^{18}$ cm$^{-3}$ and not higher than $1 \times 10^{20}$ cm$^{-3}$, and for example, around $2 \times 10^{19}$ cm$^{-3}$. Source region 14 has a thickness not smaller than 0.1 μm and not greater than 0.4 µm, and for example, around 0.3 µm. Namely, in an impurity concentration profile in a direction perpendicular to third main surface 12a in source region 14, a second position (F: see FIG. 12) at which an impurity concentration 1/10 as high as the highest impurity concentration is exhibited is, for example, around 0.3 µm.

P+ contact region 15 has the p conductivity type. P+ contact region 15 is formed adjacently to source region 14 on body region 13 and to be in contact with body region 13. P+ contact region 15 includes third main surface 12a. P+ contact region 15 contains an impurity such as aluminum (Al) or boron (B). An impurity concentration in p+ contact region 15 is higher than in body region 13, and for example, around $1 \times 10^{20}$ cm$^{-3}$. P+ contact region 15 has a thickness, for example, not greater than approximately 0.2 µm and preferably around 0.1 µm. Namely, in an impurity concentration profile (see FIG. 13) in the direction perpendicular to third main surface 12a in p+ contact region 15, a first position at which an impurity concentration 1/10 as high as the highest impurity concentration (for example, $1 \times 10^{20}$ cm$^{-3}$) is exhibited (position C at which $1 \times 10^{19}$ cm$^{-3}$ is exhibited) is, for example, not greater than approximately 0.2 µm and preferably around 0.1 Thus, p+ contact region 15 is smaller in thickness than source region 14. P+ contact region 15 is connected to body region 13 at a position approximately 0.1 µm from third main surface 12a.

Gate oxide film 16 is formed to extend from above one of source regions 14 to above the other of source regions 14 which are adjacent to each other with silicon carbide semiconductor layer 12 lying therebetween. A material for forming gate oxide film 16 is a dielectric such as silicon oxide (SiO$_2$) or silicon nitride (SiN).

Gate electrode 17 is formed to extend over gate oxide film 16, from above one of source regions 14 to above the other of source regions 14 which are adjacent to each other with silicon carbide semiconductor layer 12 lying therebetween. A material for forming gate electrode 17 is a conductor such as polysilicon or Al.

Interlayer insulating film 18 is formed to cover gate electrode 17. Interlayer insulating film 18 electrically isolates gate electrode 17 from the outside. A material for forming interlayer insulating film 18 is a dielectric such as silicon oxide (SiO$_2$) or silicon nitride (SiN).

Source electrode 19 is formed on third main surface 12a as being in contact with each of p+ contact region 15 and source region 14 formed to surround p+ contact region 15. A material for forming source electrode 19 includes, for example, titanium (Ti) atoms, aluminum (Al) atoms, and silicon (Si) atoms. Thus, source electrode 19 establishes ohmic contact with each of source region 14 and p+ contact region 15 and a contact resistance with each of them is sufficiently low.

Drain electrode 20 is formed on second main surface 11b of base substrate 11. Drain electrode 20 may be composed, for example, of a material the same as that for source electrode 19, or may be composed of another material which can establish ohmic contact with n+ substrate 11, such as nickel (Ni).

A method of manufacturing a silicon carbide semiconductor device according to the first embodiment will now be described with reference to FIGS. 2 to 11.

Figure 2:
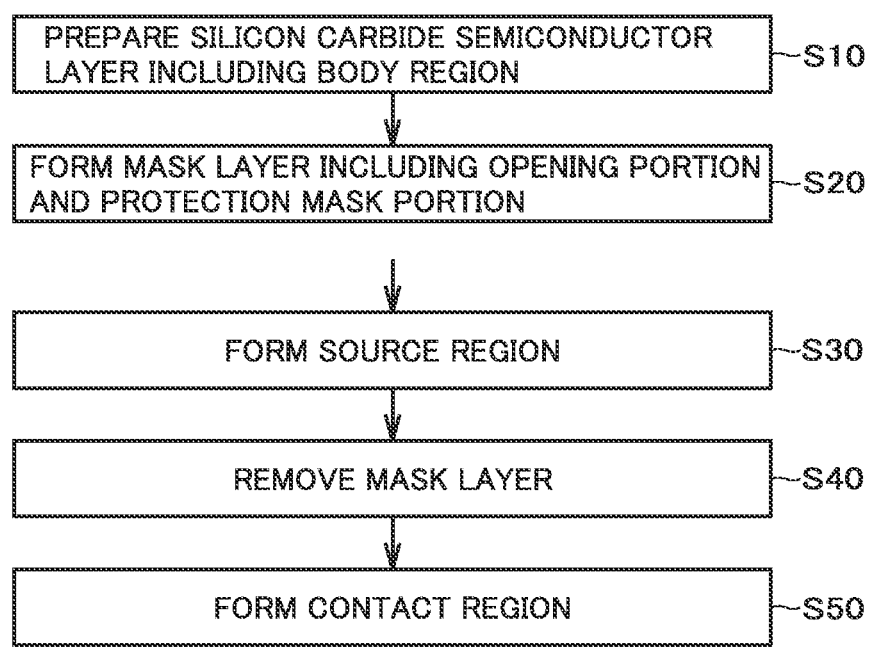
FIG. 2 is a flowchart of a method of manufacturing a silicon carbide semiconductor device according to the first embodiment.
Figure 3:
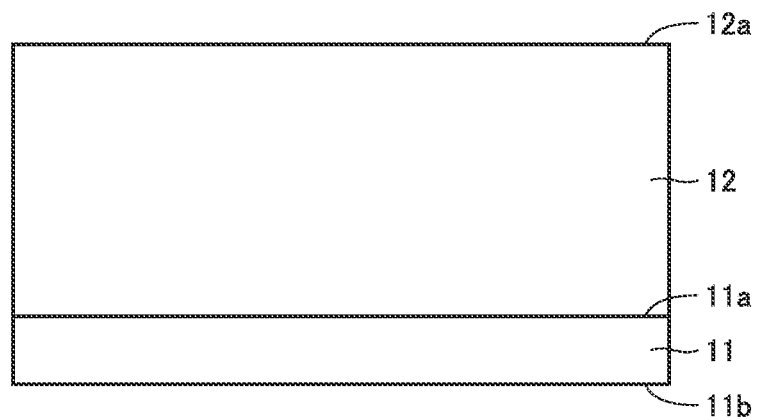
FIG. 3 is a cross-sectional view for illustrating the method of manufacturing a silicon carbide semiconductor device according to the first embodiment.

Referring to FIG. 3, initially, silicon carbide semiconductor layer 12 including body region 13 is prepared (step (S10): FIG. 2). Specifically, initially, base substrate 11 having first main surface 11a and second main surface 11b is prepared. Then, silicon carbide semiconductor layer 12 is formed on first main surface 11a of base substrate 11 through epitaxial growth.

Figure 4:
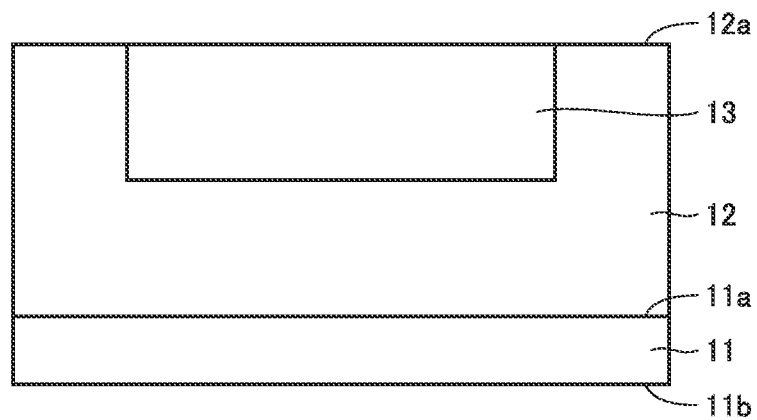
FIG. 4 is a cross-sectional view for illustrating the method of manufacturing a silicon carbide semiconductor device according to the first embodiment.

Referring to FIG. 4, then, body region 13 is formed in silicon carbide semiconductor layer 12. Specifically, body region 13 having the p conductivity type is formed by implanting ions of a p-type impurity into silicon carbide semiconductor layer 12 with a mask layer (not shown) formed on third main surface 12a being interposed.

Figure 5:
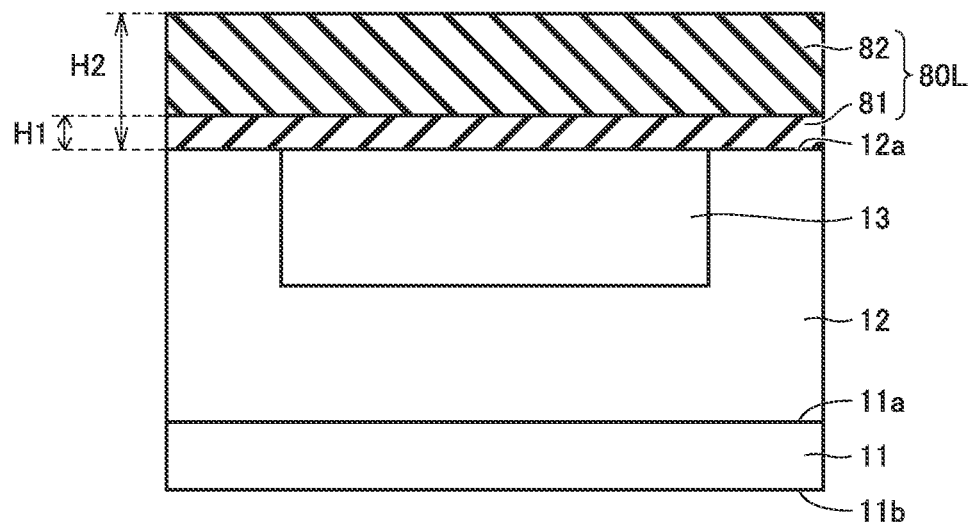
FIG. 5 is a cross-sectional view for illustrating the method of manufacturing a silicon carbide semiconductor device according to the first embodiment.

Referring to FIG. 5, then, mask layer 80 is formed (step (S20): FIG. 2). Specifically, initially, a stack 80L is formed on third main surface 12a of silicon carbide semiconductor layer 12. Stack 80L has a two-layered structure constituted of a first mask layer 81 in contact with third main surface 12a and a second mask layer 82 formed on first mask layer 81. A thickness H2 of stack 80L (a total thickness of first mask layer 81 and second mask layer 82) is formed as a thickness allowing sufficient blocking of ion implantation under ion implantation conditions in the step of forming source region 14 (S30). A thickness H1 of first mask layer 81 is not greater than 0.3 µm, and for example, 0.2 µm. A material for forming first mask layer 81 is, for example, polysilicon, and a material for forming second mask layer 82 is, for example, SiO$_2$.

Figure 6:
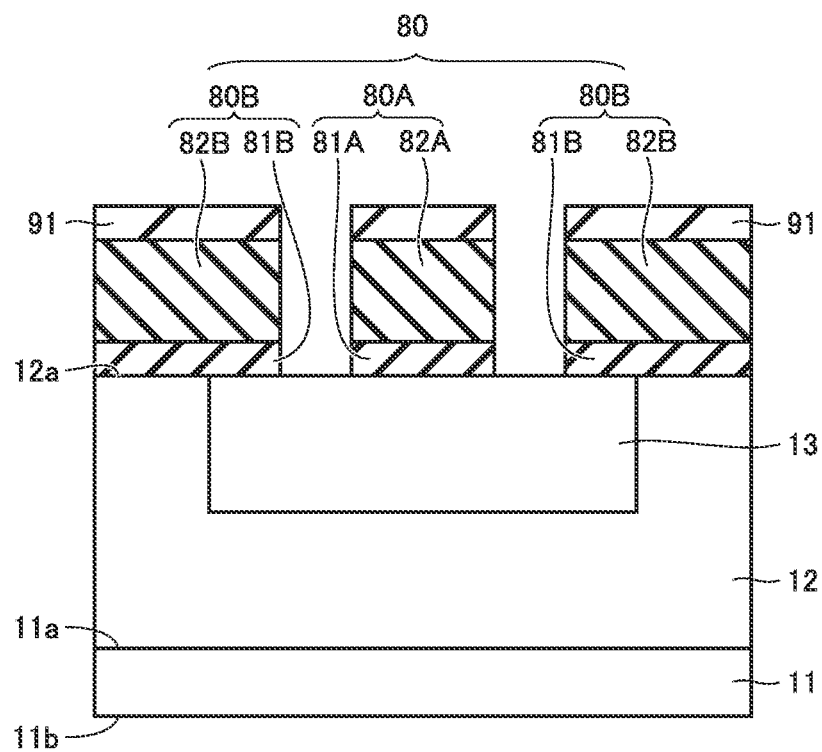
FIG. 6 is a cross-sectional view for illustrating the method of manufacturing a silicon carbide semiconductor device according to the first embodiment.

Referring to FIG. 6, then, mask layer 80 having an opening portion is formed by processing stack 80L. Mask layer 80 is constituted of a protection mask portion 80A formed independently in the opening portion and another mask portion 80B. Specifically, initially, a mask pattern 91 having an opening portion over a region where source region 14 is to be formed is formed on stack 80L. Mask pattern 91 is a resist pattern formed, for example, with photolithography. Then, for example, by dry etching stack 80L with the use of mask pattern 91, mask layer 80 having an opening portion exposing third main surface 12a located over a region where source region 14 is to be formed is formed. Here, the opening portion in mask layer 80 is formed between protection mask portion 80A formed independently in the opening portion and another mask portion 80B formed around protection mask portion 80A. Namely, when third main surface 12a is two-dimensionally viewed, protection mask portion 80A defines an end portion of source region 14 on an inner peripheral side of body region 13 and provides protection over the region where p+ contact region 15 is to be formed.

Figure 7:
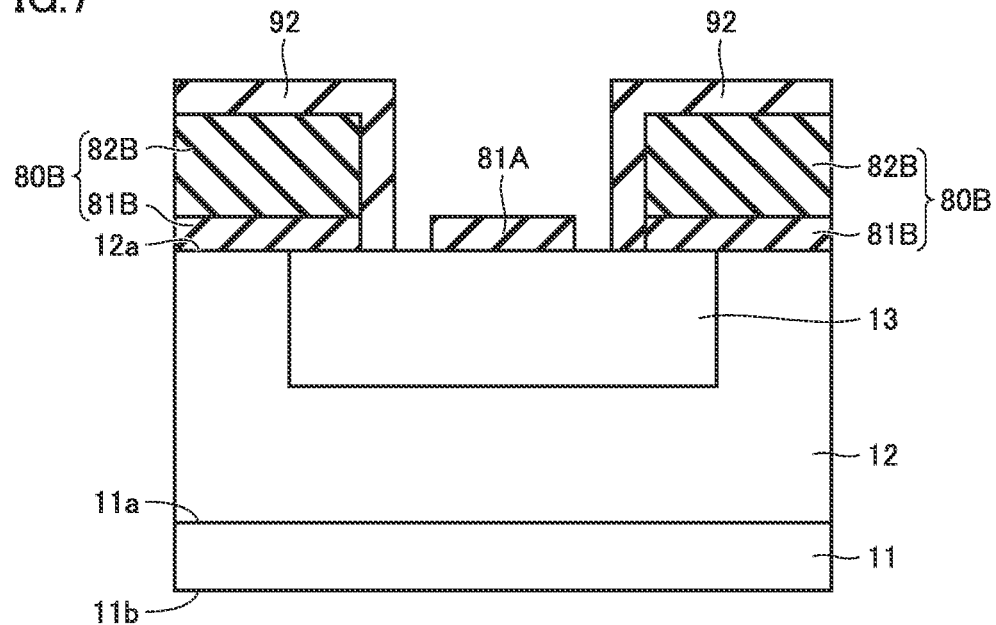
FIG. 7 is a cross-sectional view for illustrating the method of manufacturing a silicon carbide semiconductor device according to the first embodiment.

Referring to FIG. 7, then, mask layer 83 having protection mask portion 81A is formed by processing protection mask portion 80A. Specifically, a mask pattern 92 having an opening portion as protecting an upper surface of another mask portion 80B (a surface along third main surface 12a) and a side surface defining the opening portion and exposing an upper surface (a surface along third main surface 12a) and a side surface of protection mask portion 80A is formed. Then, a first mask layer 82A forming protection mask portion 80A is removed. A method of removing second mask layer 82A may be any etching method having a high selective etching ratio to first mask layer 81A, and it is, for example, dry etching. Here, since the upper surface and the side surface of another mask portion 80B are protected by mask pattern 92, another mask portion 80B is maintained before and after etching. Namely, another mask portion 80B maintains the two-layered structure of first mask layer 81B and second mask layer 82. Thus, mask layer 83 constituted of another mask portion 80B having a sufficient thickness allowing blocking of ion implantation and protection mask portion 81A smaller in thickness than another mask portion 80B is formed in the step of forming source region 14 (S30) which will be described later.

Figure 8:
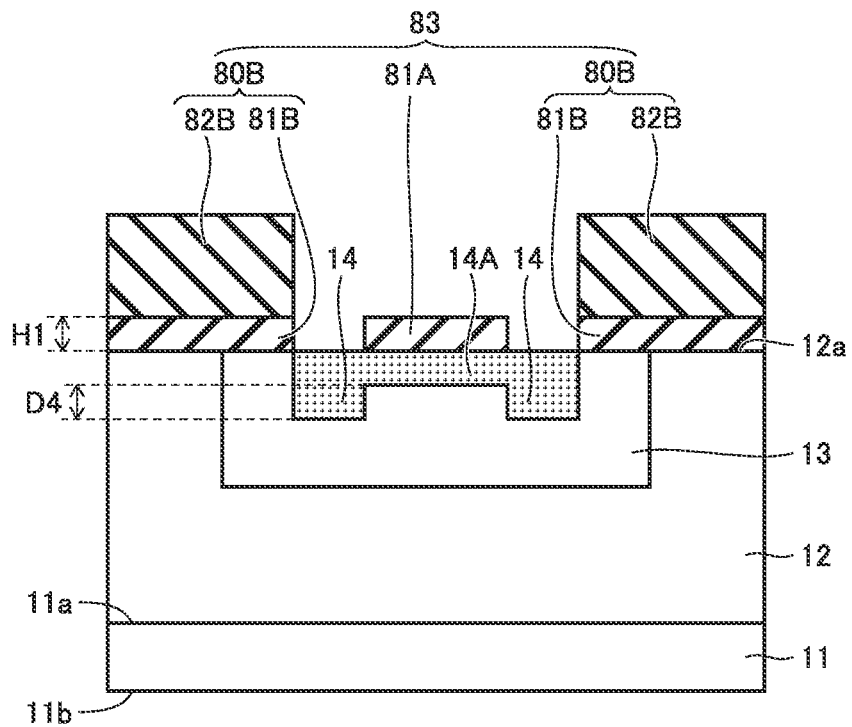
FIG. 8 is a cross-sectional view for illustrating the method of manufacturing a silicon carbide semiconductor device according to the first embodiment.

Referring to FIG. 8, then, source region 14 is formed with mask layer 83 (protection mask portion 81A and another mask portion 80B) serving as a mask (step (S30): FIG. 2). Specifically, by implanting ions of an impurity for providing the n-type into third main surface 12a with mask layer 83 serving as an implantation mask, source region 14 is formed in a region where the opening portion in mask layer 83 is formed. The impurity for providing the n-type is, for example, phosphorus (P). Here, another mask portion 80B blocks ion implantation into the region where another mask portion 80B is formed (a region to be a channel region in body region 13 and a region where silicon carbide semiconductor layer 12 is exposed at third main surface 12a).

Since protection mask portion 81A is smaller in thickness than another mask portion 80B by the thickness of second mask layer 82A, it is lower in capability to block ion implantation than another mask portion 80B. Therefore, though a dose amount is smaller in the region where protection mask portion 81A is formed (the region where p+ contact region 15 is to be formed) than in the region where the opening portion in mask layer 83 is formed, ions of the n-type impurity are implanted into that region. Consequently, n-type region 14A is formed in the region of body region 13 where protection mask portion 81A is formed. Here, a depth of n-type region 14A with respect to third main surface 12a is shallower by a depth D4 than the depth of source region 14. Here, a difference in depth D4 correlates with thickness H1 of first mask layer 81A, and it can be equal, for example, to thickness H1. Namely, when first mask layer 81A has thickness H1 of 0.2 μm, difference in depth D4 can also be 0.2 μm.

Figure 9:
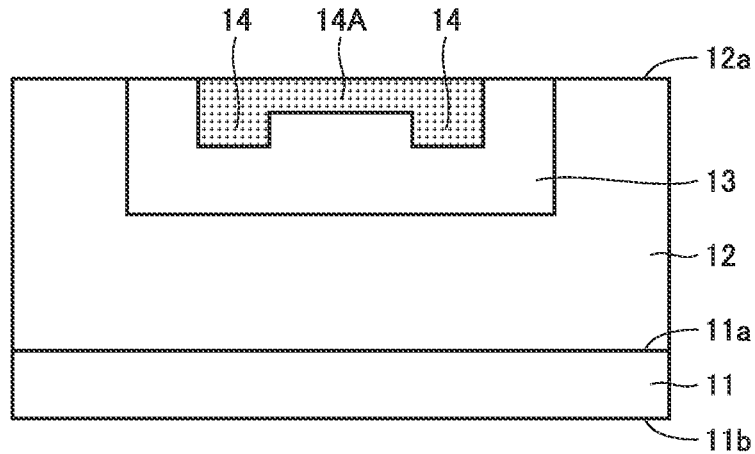
FIG. 9 is a cross-sectional view for illustrating the method of manufacturing a silicon carbide semiconductor device according to the first embodiment.

Referring to FIG. 9, then, mask layer 83 is removed (step (S40): FIG. 2). Mask layer 83 is removed, for example, through dry etching.

Figure 10:
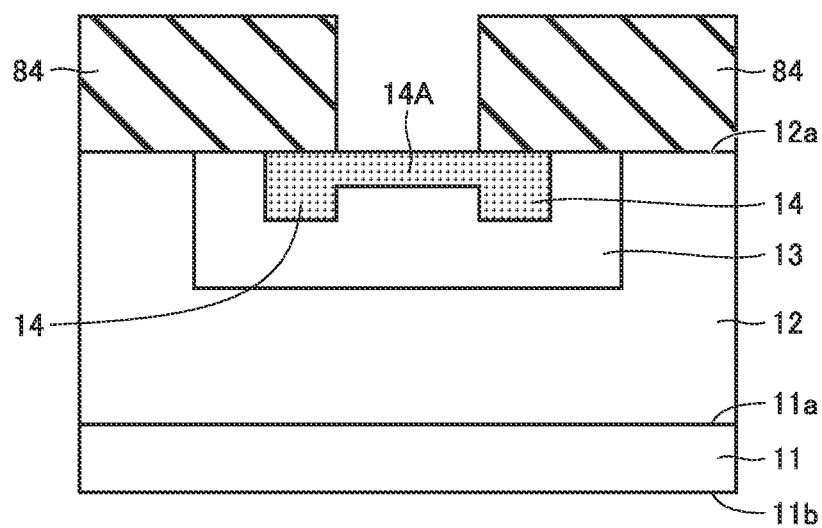
FIG. 10 is a cross-sectional view for illustrating the method of manufacturing a silicon carbide semiconductor device according to the first embodiment.
Figure 11:
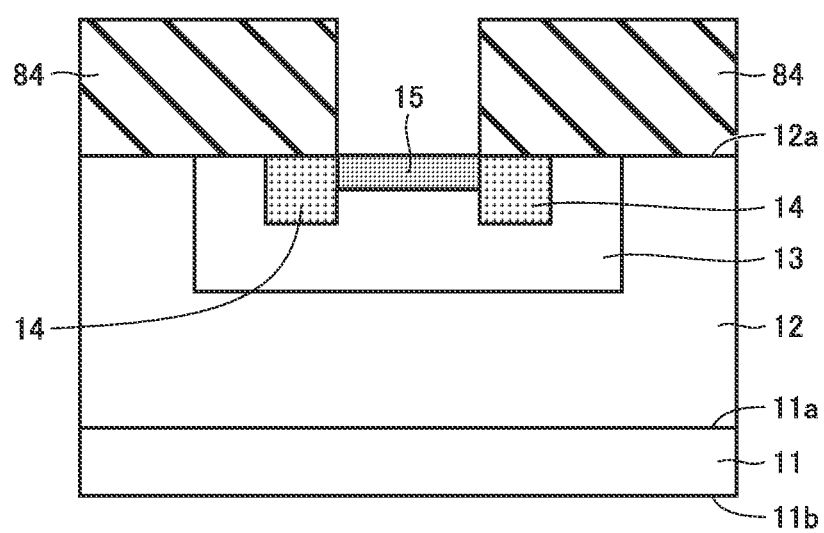
FIG. 11 is a cross-sectional view for illustrating the method of manufacturing a silicon carbide semiconductor device according to the first embodiment.

Referring to FIGS. 10 and 11, then, p+ contact region 15 is formed (step (S50): FIG. 2). Specifically, initially, referring to FIG. 10, a mask layer 84 having an opening portion over a region where p+ contact region 15 is to be formed is formed on third main surface 12a. Namely, the opening portion in mask layer 84 is formed over n-type region 14A. Mask layer 84 may be formed with any method, and formed, for example, with photolithography. Then, by implanting ions of an impurity for providing the p-type into third main surface 12a with mask layer 84 serving as the implantation mask, p+ contact region 15 is formed in the region where the opening portion in mask layer 84 is formed. Namely, in the present step (S50), p+ contact region 15 is formed to replace n-type region 14A by implanting an impurity for providing the p-type into n-type region 14A. From a different point of view, p+ contact region 15 is formed such that a depth of p+ contact region 15 with respect to third main surface 12a is shallower than a depth of source region 14 formed in the previous step (S30) with respect to third main surface 12a. Thus, p+ contact region 15 and body region 13 are connected to each other at a position shallower than the depth of source region 14 in the direction perpendicular to third main surface 12a. An impurity for providing the p-type is, for example, aluminum (Al).

Then, gate oxide film 16 is formed. Specifically, third main surface 12a is thermally oxidized. Thermal oxidation can be carried out, for example, by heating in an oxygen atmosphere to a temperature around 1300° C. and holding approximately for 40 minutes. Thus, gate oxide film 16 composed of silicon dioxide is formed on third main surface 12a. Gate oxide film 16 has a thickness, for example, around 50 nm.

Then, gate electrode 17 is formed. Specifically, gate electrode 17 is formed on gate oxide film 16 so as to extend from above one of adjacent source regions 14 to above the other of source regions 14. A material for forming gate electrode 17 is a conductive material such as polysilicon doped with an impurity or Al.

Then, interlayer insulating film 18 is formed. Specifically, interlayer insulating film 18 is formed to be in contact with gate oxide film 16 and to cover gate electrode 17. A material for forming interlayer insulating film 18 is, for example, silicon dioxide.

Then, source electrode 19 is formed. Specifically, initially, a resist mask having an opening portion over a region where source electrode 19 is to be formed is formed on gate oxide film 16 and interlayer insulating film 18. Then, gate oxide film 16 and interlayer insulating film 18 in the opening portion are etched away with the use of the resist mask. Thus, a part of source region 14 and p+ contact region 15 are exposed through the opening portion in gate oxide film 16 and interlayer insulating film 18. Then, a metal layer to be source electrode 19 is formed on the resist mask. Thereafter, source electrode 19 is formed as being in contact with a part of source region 14 and p+ contact region 15 with a lift-off method.

Then, drain electrode 20 is formed. Drain electrode 20 is formed on second main surface 11b of base substrate 11. Silicon carbide semiconductor device 100 according to the present embodiment can be obtained through a procedure above. In the obtained silicon carbide semiconductor device, depth D1 of p+ contact region 15 is approximately 0.1 μm and depth D2 of source region 14 is approximately 0.3 μm.

A function and effect of a silicon carbide semiconductor device 200 and a method of manufacturing the same according to the first embodiment will now be described.

In the silicon carbide semiconductor device according to the first embodiment, while p+ contact region 15 is formed to be shallower with respect to third main surface 12a than source region 14 adjacent in body region 13, it is connected to body region 13 in the direction perpendicular to third main surface 12a. Here, source region 14 and p+ contact region 15 establish ohmic contact with source electrode 19 on third main surface 12a. Therefore, source region 14, p+ contact region 15, and body region 13 connected to p+ contact region 15 can be the same in potential.

Furthermore, while the silicon carbide semiconductor device according to the first embodiment includes p+ contact region 15 high in concentration of an impurity, efficiency in manufacturing the same can be improved. As described above, p+ contact region 15 is formed to be shallower with respect to third main surface 12a than source region 14 adjacent in body region 13. Therefore, a dose amount required for forming p+ contact region 15 can be kept smaller than in a case that p+ contact region 15 is formed to a depth as deep as or deeper than the second position of source region 14 with respect to third main surface 12a. Thus, an implantation time period required for forming p+ contact region 15 can be shortened. Consequently, the silicon carbide semiconductor device according to the present embodiment can achieve a sufficiently lowered contact resistance between source electrode 19 and p+ contact region 15 (body region 13) and improvement in manufacturing efficiency.

According to the method of manufacturing a silicon carbide semiconductor device according to the first embodiment, in the step of forming source region 14 (S30), a region where p+ contact region 15 is to be formed is protected by protection mask portion 81A. Therefore, when a dose amount necessary for forming source region 14 is implanted in the step (S30), protection mask portion 81A restricts ion implantation into the region where p+ contact region 15 is to be formed. Consequently, n-type region 14A (see FIG. 8) is formed to be shallower than source region 14 in body region 13 where p+ contact region 15 is to be formed. Therefore, in the step (S50), a dose amount necessary in forming p+ contact region 15 for connection to body region 13 can be kept small.

Consequently, according to the method of manufacturing a silicon carbide semiconductor device according to the first embodiment, an implantation time period required for forming p+ contact region 15 can be shorter than in the conventional method, and a silicon carbide semiconductor device sufficiently low in contact resistance between source electrode 19 and p+ contact region 15 can be obtained at high manufacturing efficiency.

Mask layer 83 is constituted of protection mask portion 81A formed from first mask layer 81 and another mask portion 80B constituted of two layers of first mask layer 81 and second mask layer 82. In such a mask layer 83, protection mask portion 81A smaller in thickness by the thickness of second mask layer 82 can readily be formed by removing second mask layer 82A in protection mask portion 80A constituted of the two layers as described above.

Here, referring to FIGS. 12 and 13, depth D1 of p+ contact region 15 with respect to third main surface 12a can be calculated based on an impurity concentration profile in the direction perpendicular to third main surface 12a of the silicon carbide semiconductor device. The impurity concentration profile of the silicon carbide semiconductor device can be determined, for example, with secondary ion mass spectrometry (SIMS). FIG. 13 shows an impurity concentration profile in p+ contact region 15 and body region 13 in the direction perpendicular to third main surface 12a from a point A at third main surface 12a in FIG. 12. FIG. 14 shows an impurity concentration profile in source region 14 and body region 13 in the direction perpendicular to third main surface 12a from a point E at third main surface 12a in FIG. 12. The ordinate in each of FIGS. 13 and 14 represents a depth with respect to third main surface 12a, and the abscissa represents an impurity concentration. As described above, a "depth" of each impurity region in silicon carbide semiconductor layer 12 herein refers to a distance between third main surface 12a and a position at which an impurity concentration 1/10 as high as the highest impurity concentration is exhibited in the impurity concentration profile in the direction perpendicular to third main surface 12a of silicon carbide semiconductor layer 12. Namely, a depth of p+ contact region 15 with respect to third main surface 12a is defined as distance D1 between third main surface 12a and a point C at which an impurity concentration one tenth as high as the highest impurity concentration P1 is exhibited in p+ contact region 15 and body region 13.

Referring to FIG. 13, a point D at which highest impurity concentration P1 of a concentration of the p-type impurity is exhibited is located on a side of second main surface 11b at a depth D3 from point A. In the first embodiment, highest impurity concentration P1 is around $1 \times 10^{20}$ cm$^{-3}$, and point D is located in p+ contact region 15. Furthermore, point C at which an impurity concentration one tenth as high as highest impurity concentration P1 is exhibited is located on the side of second main surface 11b at depth D1 from point A.

Referring to FIG. 14, depth D2 of source region 14 with respect to third main surface 12a can also be determined similarly based on the impurity concentration profile in source region 14 and body region 13 in the direction perpendicular to third main surface 12a from point E at third main surface 12a. Namely, a depth of source region 14 with respect to third main surface 12a is defined as a distance D2 between third main surface 12a and a point F at which an impurity concentration one tenth as high as a highest impurity concentration N1 is exhibited in source region 14 and body region 13.

Thus, in the silicon carbide semiconductor layer according to the first embodiment, a relational expression D1<D2 is satisfied, where D1 represents a depth of p+ contact region 15 with respect to third main surface 12a defined based on the impurity concentration profile determined with SIMS and D2 represents a depth of source region 14 with respect to third main surface 12a. Thus, as described above, in the method of manufacturing a silicon carbide semiconductor device according to the first embodiment, an implantation time period required for forming p+ contact region 15 can be shortened.

As described above, depth D1 of p+ contact region 15 with respect to third main surface 12a defined based on the impurity concentration profile is formed to be greater than a depth of n-type region 14A with respect to third main surface 12a. Here, a depth of n-type region 14A formed under a certain implantation condition with respect to third main surface 12a correlates with thickness H1 of protection mask portion 81A employed as the implantation mask. Therefore, by knowing correlation between thickness H1 of protection mask portion 81A and a depth of n-type region 14A with respect to third main surface 12a in advance, a depth of n-type region 14A can be controlled by controlling thickness H1 of protection mask portion 81A. Since depth D1 of p+ contact region 15 with respect to third main surface 12a should be at least equal to or greater than a depth of n-type region 14A with respect to main surface 12a, a necessary and sufficient condition for depth D1 can be controlled based on thickness H1 of protection mask portion 81A. Here, difference D3 between depth D1 and depth D2 of source region 14 with respect to third main surface 12a can be approximately equal to thickness H1 of protection mask portion 81A. Namely, when ion implantation for forming source region 14 having depth D2 of approximately 0.3 µm with respect to third main surface 12a is carried out with the use of protection mask portion 81A having thickness H1 of approximately 0.2 µm, n-type region 14A is formed to a depth, for example, of approximately 0.1 µm from third main surface 12a. Therefore, p+ contact region 15 is formed to a depth not smaller than 0.1 µm from third main surface 12a, so that it can be connected to body region 13.

Second Embodiment

A silicon carbide semiconductor device and a method of manufacturing the same according to a second embodiment will now be described with reference to FIGS. 1 and 15 to 17. Though the silicon carbide semiconductor device according to the second embodiment is basically the same in feature as the silicon carbide semiconductor device and the method of manufacturing the same according to the first embodiment, it is different in that n-type region 14A is not formed in a region where p+ contact region 15 is to be formed in the step of forming source region 14 (S30) in the method of manufacturing a silicon carbide semiconductor device, that is, different in that p+ contact region 15 is formed by implanting ions of a p-type impurity into p body region 13, rather than by forming p+ contact region 15 as replacement for n-type region 14A by implanting ions of a p-type impurity into n-type region 14A in the step of forming p+ contact region 15 (S50). A construction of the silicon carbide semiconductor device obtained with the method of manufacturing a silicon carbide semiconductor device according to the second embodiment is the same as that of silicon carbide semiconductor device 100 according to the first embodiment shown in FIG. 1.

The method of manufacturing a silicon carbide semiconductor device according to the second embodiment will be described with reference to FIGS. 15 to 17.

Initially, as in the method of manufacturing a silicon carbide semiconductor device according to the first embodiment, silicon carbide semiconductor layer 12 including body region 13 is prepared (step (S10), see FIGS. 3 and 4). Then, stack 80L is formed on third main surface 12a of silicon carbide semiconductor layer 12 (step (S20), see FIG. 5). Specifically, initially, stack 80L is formed. Stack 80L has the two-layered structure constituted of first mask layer 81 in contact with third main surface 12a and second mask layer 82 formed on first mask layer 81.

Then, mask layer 80 having an opening portion is formed by processing stack 80L (see FIG. 6). Specifically, initially, mask pattern 91 having an opening portion over a region where source region 14 is to be formed is formed on stack 80L. Mask pattern 91 is a resist pattern formed, for example, with photolithography. Then, mask layer 80 having an opening portion exposing third main surface 12a located over the region where source region 14 is to be formed is formed, for example, by dry etching stack 80L with the use of mask pattern 91. Mask layer 80 is constituted of another mask portion 80B having a thickness sufficient to allow blocking of ion implantation in the step of forming source region 14 (S30) which will be described later and protection mask portion 80A comparable in thickness to another mask portion 80B. When third main surface 12a is two-dimensionally viewed, protection mask portion 80A defines the end portion of source region 14 on the inner peripheral side of body region 13 and provides protection over the region where p+ contact region 15 is to be formed.

Figure 15:
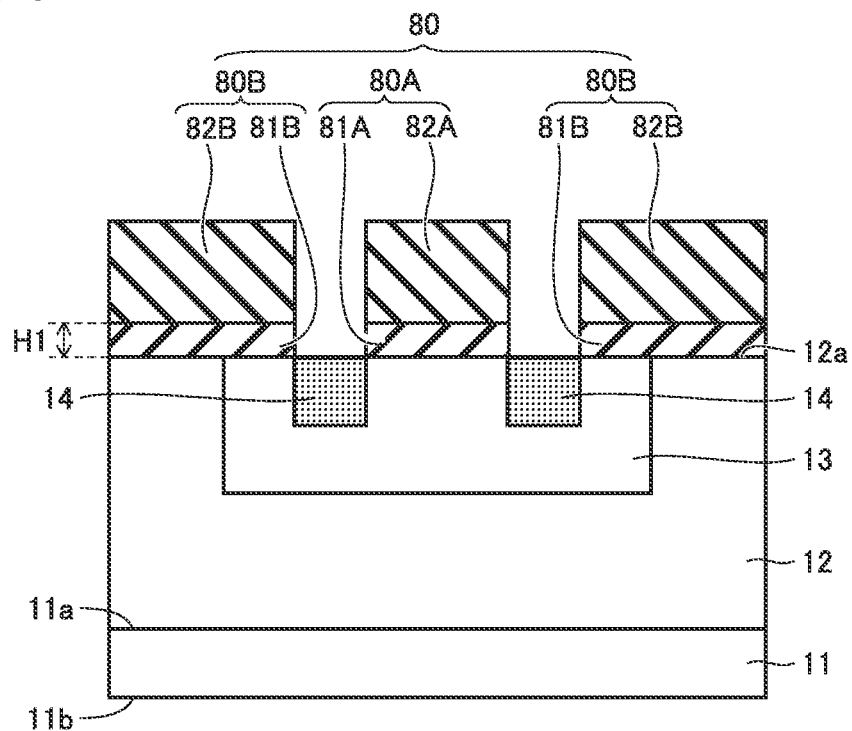
FIG. 15 is a cross-sectional view for illustrating a method of manufacturing a silicon carbide semiconductor device according to a second embodiment.

Referring to FIG. 15, then, source region 14 is formed with mask layer 80 serving as an ion implantation mask (step (S30)). Specifically, by implanting ions of an impurity for providing the n-type into third main surface 12a with mask layer 80 serving as an implantation mask, source region 14 is formed in the region where the opening portion in mask layer 80 is formed. Here, since protection mask portion 80A and another mask portion 80B are both provided to be able to block ion implantation in the present step (S30), implantation of ions of the n-type impurity into the region where another mask portion 80B is formed (a region to be a channel region in body region 13 and a region where silicon carbide semiconductor layer 12 is exposed at third main surface 12a) and the region where protection mask portion 80A is formed (the region where p+ contact region 15 is to be formed) is blocked. Consequently, by performing the present step (S30), no n-type region 14A is formed in the region in body region 13 where protection mask portion 80A is formed.

Figure 16:
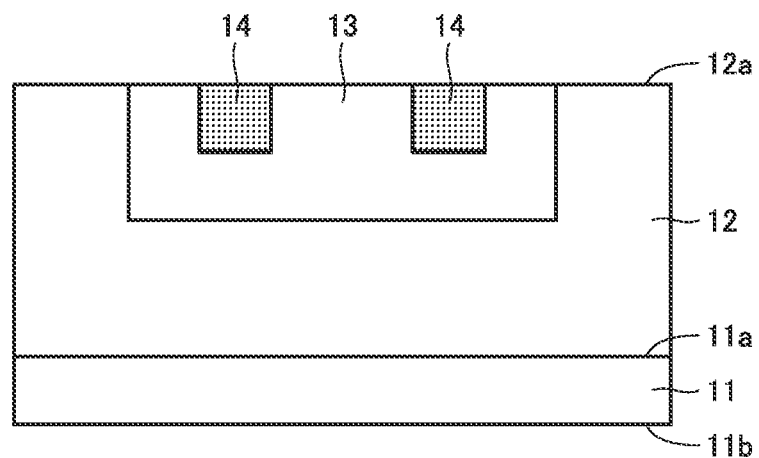
FIG. 16 is a cross-sectional view for illustrating the method of manufacturing a silicon carbide semiconductor device according to the second embodiment.

Referring to FIG. 16, then, mask layer 83 is removed (step (S40)). Mask layer 80 is removed, for example, through dry etching.

Figure 17:
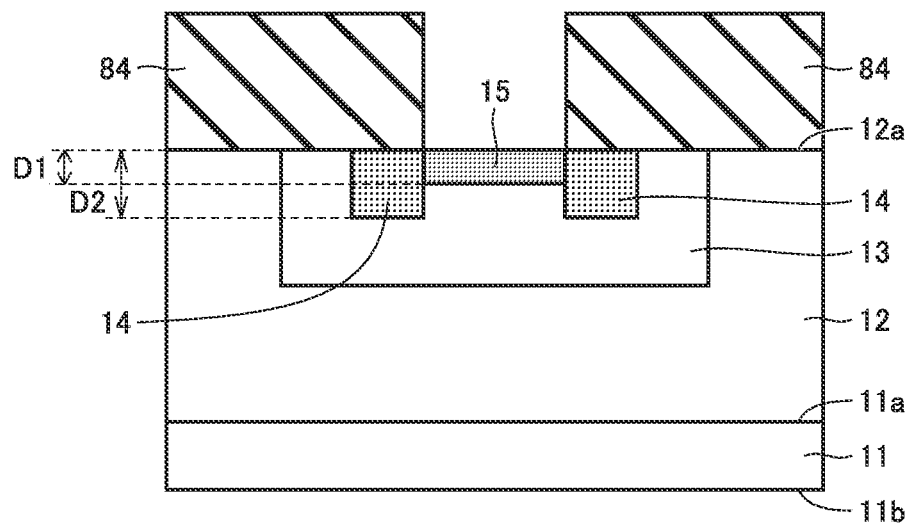
FIG. 17 is a cross-sectional view for illustrating the method of manufacturing a silicon carbide semiconductor device according to the second embodiment.

Referring to FIG. 17, then, p+ contact region 15 is formed (step (S50)). Specifically, initially, mask layer 84 having an opening portion over the region where p+ contact region 15 is to be formed is formed on third main surface 12a. Namely, the opening portion in mask layer 84 is formed over body region 13 surrounded by source region 14. Mask layer 84 may be formed with any method, and formed, for example, with photolithography. Then, p+ contact region 15 is formed in the region where the opening portion in mask layer 84 is formed by implanting ions of an impurity for providing the p-type into third main surface 12a with mask layer 84 serving as an implantation mask. Namely, in the present step (S50), p+ contact region 15 higher in impurity concentration than body region 13 is formed in body region 13 by implanting an impurity for providing the p-type into body region 13. Thus, p+ contact region 15 and body region 13 are connected to each other in the direction perpendicular to third main surface 12a. An impurity for providing the p-type is, for example, aluminum (Al).

Then, gate oxide film 16 is formed. Gate electrode 17, interlayer insulating film 18, source electrode 19, and drain electrode 20 are hereafter formed in a procedure the same as in the method of manufacturing a silicon carbide semiconductor device according to the first embodiment. Through the procedure above, the silicon carbide semiconductor device according to the second embodiment can be obtained.

A function and effect of the method of manufacturing a silicon carbide semiconductor device according to the second embodiment will now be described.

In the method of manufacturing a silicon carbide semiconductor device according to the second embodiment, in the step of forming source region 14 (S30), the region where p+ contact region 15 is to be formed is protected by protection mask portion 80A as thick as another mask portion 80B. Therefore, when a dose amount necessary for forming source region 14 is implanted in the step (S30), ion implantation into the region where p+ contact region 15 is to be formed is blocked by protection mask portion 80A. Consequently, n-type region 14A (see FIG. 8) having the n-type is not formed in body region 13 where p+ contact region 15 is to be formed through ion implantation in the step (S30) (FIG. 15). Therefore, in the step (S50), since p+ contact region 15 can be formed by implanting ions of the p-type impurity into body region 13, a dose amount required in forming p+ contact region 15 for connection to body region 13 can be kept small.

Namely, according to the method of manufacturing a silicon carbide semiconductor device according to the second embodiment, a dose amount necessary for forming p+ contact region 15 can be kept small, and hence an implantation time period required for forming p+ contact region 15 can be shorter than in the conventional method. Consequently, a silicon carbide semiconductor device sufficiently low in contact resistance between source electrode 19 and p+ contact region 15 can be obtained at high manufacturing efficiency.

In the method of manufacturing a silicon carbide semiconductor device according to the first and second embodiments, mask layers 80 and 83 are formed from stack 80L having a two-layered structure of first mask layer 81 and second mask layer 82, however, limitation thereto is not intended. For example, stack 80L may be constituted of three or more layers. By doing so as well, protection mask portion 80A as thick as another mask portion 80B can readily be formed. By providing a high selective etching ratio for each layer, protection mask portion 81A smaller in thickness than another mask layer 80B can also readily be formed. In the method of manufacturing a silicon carbide semiconductor device according to the second embodiment, mask layer 80 may be formed as a single-layered structure composed of a single material. By doing so as well, protection mask portion 80A as thick as another mask portion 80B can readily be formed. A material for forming mask layers 80 and 83 is not limited to polysilicon or SiO$_2$, and may be at least one selected from among polysilicon, SiO$_2$, aluminum (Al), and tungsten (W). In mask layers 80 and 83, for example, first mask layer 81 may be composed of titanium (Ti) and second mask layer 82 may be composed of W.

Though the silicon carbide semiconductor device according to each of the first and second embodiments is implemented as a planar MOSFET, limitation thereto is not intended. Referring to FIG. 18, the silicon carbide semiconductor device according to each of the first and second embodiments may be implemented, for example, as a trench MOSFET. Namely, silicon carbide semiconductor layer 12, body region 13, and source region 14 may be exposed at sidewall SW of trench TR and gate oxide film 16 may be formed to cover trench TR. Here, gate electrode 17 is formed on gate oxide film 16. Thus, a conduction channel is formed in body region 13 exposed at sidewall SW. Furthermore, when sidewall SW of trench TR microscopically includes a first plane having a plane orientation {0-33-8}, mobility of the conduction channel formed in body region 13 exposed at sidewall SW can be enhanced. Furthermore, an interface state density at the interface between gate oxide film 16 and body region 13 formed on sidewall SW can be lowered. Here, "microscopic" means in detail to such an extent that a dimension about twice as large as interatomic spacing is at least taken into consideration. As a method of observing such a microscopic structure, for example, TEM (Transmission Electron Microscope) can be employed.

Though the embodiments of the present invention have been described above, it should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

REFERENCE SIGNS LIST 10 epitaxial substrate; 11 substrate; 11a first main surface; 11b second main surface; 12 silicon carbide semiconductor layer; 12a, 12b third main surface; 13 body region; 14 source region; 14A n-type region; 15 p+ contact region; 16 gate oxide film; 17 gate electrode; 18 interlayer insulating film; 19 source electrode; 20 drain electrode; 80, 83 mask layer; 80A protection mask portion; 80B another mask portion; 81 first mask layer; 82 second mask layer; 81A protection mask portion (first mask layer); 82A protection mask portion (second mask layer); 81B another mask portion (first mask layer); 82B another mask portion (second mask layer); 91, 92 mask pattern; 100 silicon carbide semiconductor device; TR trench; and SW sidewall.

The invention claimed is:
1. A silicon carbide semiconductor device, comprising:
a silicon carbide semiconductor layer including a main surface; and
an electrode formed on the main surface,
the silicon carbide semiconductor layer including
a first impurity region having a first conductivity type,
a second impurity region including the main surface, provided in the first impurity region, and having a second conductivity type different from the first conductivity type, and
a third impurity region including the main surface, provided in the first impurity region, formed adjacently to the second impurity region, and having the first conductivity type,
wherein a first position exists at which an impurity concentration 1/10 as high as a highest impurity concentration is exhibited in a concentration profile of an impurity having the first conductivity type in a direction perpendicular to the main surface in the third impurity region and a second position exists at which an impurity concentration 1/10 as high as a highest impurity concentration is exhibited in a concentration profile of an impurity having the second conductivity type in the direction perpendicular to the main surface in the second impurity region, a first depth from the main surface to the first position being shallower than a second depth from the main surface to the second position, and
the electrode being electrically connected to the second impurity region and the third impurity region.
2. The silicon carbide semiconductor device according to claim 1, wherein
a depth from the main surface, of a position at which the highest impurity concentration is exhibited in the third impurity concentration is not greater than 0.1 μm.
3. The silicon carbide semiconductor device according to claim 1, wherein
the first depth is not greater than 0.2 μm.
4. The silicon carbide semiconductor device according to claim 1, wherein
the silicon carbide semiconductor layer is provided with a trench at which the first impurity region and the second impurity region are exposed at a sidewall, and
the silicon carbide semiconductor device further comprises a gate oxide film formed on the sidewall of the trench and a gate electrode formed on the gate oxide film.
5. The silicon carbide semiconductor device according to claim 4, wherein the sidewall includes a first plane having a plane orientation {0-33-8}.
6. The silicon carbide semiconductor device according to claim 1, wherein
the first impurity region includes the main surface, and
the silicon carbide semiconductor device further comprises a gate oxide film formed on the main surface included in the first impurity region and a gate electrode formed on the gate oxide film.
7. A method of manufacturing a silicon carbide semiconductor device, comprising the steps of:
preparing a silicon carbide semiconductor layer including a first impurity region having a first conductivity type;
forming a mask layer on a main surface of the silicon carbide semiconductor layer, an opening portion being formed over the first impurity region in the mask layer and the mask layer including in the opening portion, a protection mask portion arranged at a distance from an inner peripheral wall surface of the opening portion;
forming a second impurity region having a second conductivity type different from the first conductivity type by implanting ions into the first impurity region other than at least a region under the protection mask portion in the opening portion with the mask layer serving as a mask;
removing the mask layer; and
forming a third impurity region having the first conductivity type in a region within the first impurity region which has been located under the protection mask portion, by implanting ions into the silicon carbide semiconductor layer, in the step of forming a mask layer, the protection mask portion is formed to be smaller in thickness than a portion in the mask layer other than the protection mask portion, and in the step of forming a second impurity region, a fourth impurity region having the second conductivity type is formed by implanting ions into the silicon carbide semiconductor layer with the protection mask portion being interposed.

8. A method of manufacturing a silicon carbide semiconductor device, comprising the steps of:

preparing a silicon carbide semiconductor layer including a first impurity region having a first conductivity type;

forming a mask layer on a main surface of the silicon carbide semiconductor layer, an opening portion being formed over the first impurity region in the mask layer and the mask layer including in the opening portion, a protection mask portion arranged at a distance from an inner peripheral wall surface of the opening portion;

forming a second impurity region having a second conductivity type different from the first conductivity type by implanting ions into the first impurity region other than at least a region under the protection mask portion in the opening portion with the mask layer serving as a mask;

removing the mask layer; and forming a third impurity region having the first conductivity type in a region within the first impurity region which has been located under the protection mask portion, by implanting ions into the silicon carbide semiconductor layer, wherein in the step of forming a third impurity region, a first position exists at which an impurity concentration 1/10 as high as a highest impurity concentration is exhibited in a concentration profile of an impurity having the first conductivity type in a direction perpendicular to the main surface in the third impurity region and a second position exists at which an impurity concentration 1/10 as high as a highest impurity concentration is exhibited in a concentration profile of an impurity having the second conductivity type in the direction perpendicular to the main surface in the second impurity region which has been formed in the step of forming a second impurity region, the third impurity region is formed such that a first depth from the main surface to the first position is shallower than a second depth from the main surface to the second position.

9. The method of manufacturing a silicon carbide semiconductor device according to claim 7, wherein in the step of forming a mask layer, the mask layer in which the protection mask portion is formed from a single layer and a portion other than the protection mask portion is formed from two layers is formed.

10. The method of manufacturing a silicon carbide semiconductor device according to claim 8, wherein in the step of forming a mask layer, the mask layer in which the protection mask portion is formed from a single layer and a portion other than the protection mask portion is formed from two layers is formed.

* * * * *